(12) United States Patent
Chuang et al.

(10) Patent No.: US 8,125,051 B2
(45) Date of Patent: Feb. 28, 2012

(54) DEVICE LAYOUT FOR GATE LAST PROCESS

(75) Inventors: Harry Chuang, Hsin-Chu (TW);
Kong-Beng Thei, Hsin-Chu County (TW); Chiung-Han Yeh, Tainan (TW); Mong-Song Liang, Hsin-Chu (TW); Hou-Ju Li, Hsin-Chu (TW); Ming-Yuan Wu, Hsinchu (TW); Tzung-Chi Lee, Banciao (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 314 days.

(21) Appl. No.: 12/471,091

(22) Filed: May 22, 2009

(65) Prior Publication Data

US 2010/0001369 A1    Jan. 7, 2010

Related U.S. Application Data

(60) Provisional application No. 61/078,117, filed on Jul. 3, 2008.

(51) Int. Cl.
*H01L 27/06* (2006.01)
*H01L 21/70* (2006.01)
*H01L 21/338* (2006.01)
*H01L 21/302* (2006.01)

(52) U.S. Cl. .......... 257/539; 257/511; 257/E27.017; 257/E21.444; 438/183; 438/692

(58) Field of Classification Search .......... 257/511, 257/526, 539, E27.017, E27.019, E21.444, 257/E21.453, E21.696; 438/183, 234, 321, 359, 692

See application file for complete search history.

(56) References Cited

U.S. PATENT DOCUMENTS

| | | | | |
|---|---|---|---|---|
| 5,618,688 A * | 4/1997 | Reuss et al. | | 438/189 |
| 5,716,881 A * | 2/1998 | Liang et al. | | 438/238 |
| 5,889,335 A * | 3/1999 | Kuroi et al. | | 257/797 |
| 6,022,778 A * | 2/2000 | Contiero et al. | | 438/268 |
| 6,559,055 B2 * | 5/2003 | Tuan et al. | | 438/692 |
| 6,784,121 B1 * | 8/2004 | Jin et al. | | 438/784 |
| 7,315,054 B1 | 1/2008 | Moench et al. | | |
| 2005/0056881 A1 * | 3/2005 | Yeo et al. | | 257/315 |
| 2006/0017115 A1 * | 1/2006 | Tu et al. | | 257/371 |
| 2006/0163665 A1 * | 7/2006 | Chuang et al. | | 257/374 |
| 2007/0228440 A1 | 10/2007 | Chaudhry et al. | | |
| 2007/0254398 A1 * | 11/2007 | Wakabayashi et al. | | 438/59 |
| 2010/0032766 A1 * | 2/2010 | Chen et al. | | 257/370 |

FOREIGN PATENT DOCUMENTS

WO    WO 2007142622 A1 * 12/2007

* cited by examiner

*Primary Examiner* — Zandra Smith
*Assistant Examiner* — Jeremy Joy
(74) *Attorney, Agent, or Firm* — Haynes and Boone, LLP

(57) ABSTRACT

A semiconductor device is provided that includes a semiconductor substrate having a first region and a second region, transistors having metal gates formed in the first region, an isolation structure formed in the second region, at least one junction device formed proximate the isolation structure in the second region, and a stopping structure formed overlying the isolation structure in the second region.

20 Claims, 14 Drawing Sheets

DEVICE LAYOUT FOR GATE LAST PROCESS

PRIORITY DATA

This application claims priority to U.S. Provisional Application No. 61/078,117, entitled "JUNCTION DEVICE LAYOUT FOR METAL GATE LAST PROCESS," filed Jul. 3, 2008 which is hereby incorporated herein by reference.

BACKGROUND

Semiconductor device geometries continue to dramatically decrease in size since such devices were first introduced several decades ago. Today's fabrication plants are routinely producing devices having feature dimensions less than 65 nm. However, solving the problems associated with implementing new process and equipment technology while continuing to satisfy device requirements has become more challenging. For example, metal-oxide semiconductor (MOS) transistors have typically been formed with polysilicon gate electrodes. Polysilicon material has been used due to its thermal resistive properties during high temperature processing, which allows it to be annealed at high temperatures along with source/drain structures. Furthermore, polysilicon's ability to block the ion implantation of doping atoms into the channel region is advantageous, as it allows for the easy formation of self aligned source/drain structures after gate patterning is completed.

In some IC designs, there has been a desire to replace the polysilicon gate electrode with a metal gate electrode to improve device performance as feature sizes continue to decrease. A gate last process may be implemented to address the concerns of high temperature processing on metal materials. In a gate last process, the metal gate structure may be formed after formation of the source/drain structures. However, problems arise when integrating the gate last process with other fabrication technologies such as a junction device layout and/or a resistor device layout.

SUMMARY

One of the broader forms of an embodiment of the present invention involves a semiconductor device. The semiconductor device includes a semiconductor substrate having a first region and a second region; a plurality of transistors formed in the first region and having metal gates; an isolation structure formed in the second region; at least one junction device formed proximate the isolation structure in the second region; and a stopping structure formed overlying the isolation structure in the second region.

Another one of the broader forms of an embodiment of the present invention involves a method for fabricating a semiconductor device. The method includes providing a semiconductor substrate having a first region and a second region; forming a plurality of transistors in the first region, the transistors having metal gates; forming an isolation structure in the second region; forming at least one junction device proximate the isolation structure in the second region; and forming a stopping structure overlying the isolation structure in the second region.

Yet another one of the broader forms of an embodiment of the present invention involves a semiconductor device. The semiconductor device includes a semiconductor substrate having a first region, a second region, and a third region, the first, second, and third regions being isolated from one another; at least one transistor formed in the first region, the at least one transistor having a high-k gate dielectric and metal gate electrode; at least one junction device formed adjacent to an isolation structure in the second region; a stopping structure formed on the isolation structure in the second region; at least one resistive device formed in the third region; and a dummy gate structure formed proximate the at least one resistive device. The stopping structure has a surface that is coplanar with a surface of the metal gate electrode of each transistor.

DETAILED DESCRIPTION

Figure 1:
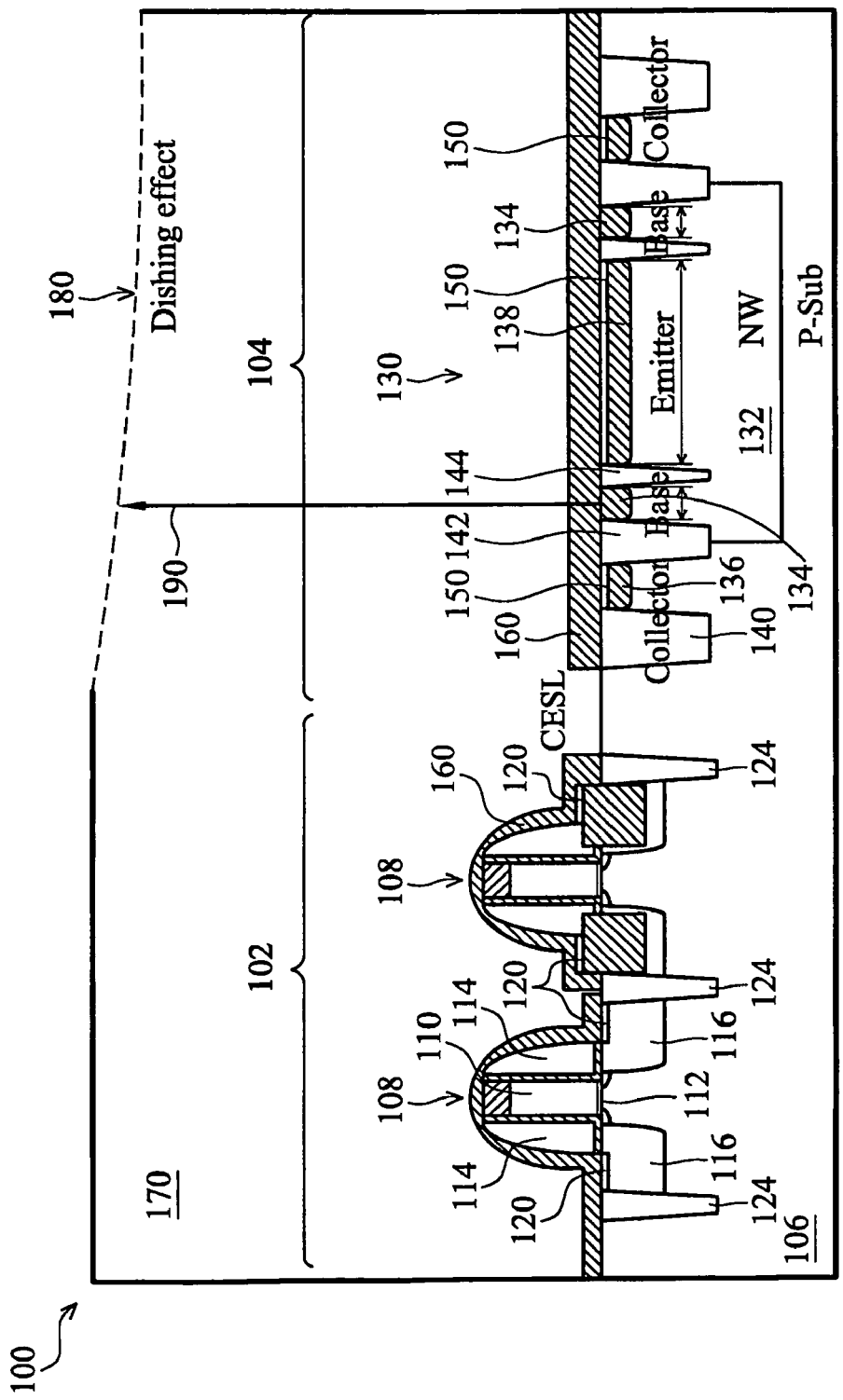
FIG. 1 is a cross-sectional view of a semiconductor device at an intermediate stage of fabrication in a gate first process.

The present disclosure relates generally to forming an integrated circuit device on a substrate and, more particularly, to fabricating a decoupling capacitor as part of an integrated circuit. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a semiconductor device 100 at an intermediate stage of fabrication in a gate first process. In the gate first process, true gate structures (e.g., gate dielectric and/or gate electrode) of transistors are formed prior to formation of the source/drain features of the transistors. In the present example, the semiconductor device 100 includes regions 102 and 104 in which various passive and active microelectronic devices are formed as part of an integrated circuit (IC). For example, the IC may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

The semiconductor device 100 includes a semiconductor substrate 106 such as a silicon substrate. The substrate 106 may include a P-doped substrate (e.g., P-type substrate). It should be noted that various other doping configuration may be implemented for the substrate as is known in the art. The substrate 106 may also include other elementary semiconductors such as germanium and diamond. Alternatively, the substrate 106 may include a compound semiconductor and/or an alloy semiconductor. Further, the substrate 106 may optionally include an epitaxial layer (epi layer), may be strained for performance enhancement, and may include a silicon-on-insulator (SOI) structure.

The region 102 may include a plurality of transistors 108 such as FETs. The transistors 108 may be configured as P-channel or N-channel as is known in the art. The transistors 108 may include a gate dielectric 110 and gate electrode 112. The gate dielectric 110 may include a high k dielectric material such as hafnium oxide ($HfO_2$). Alternatively, the gate dielectric 110 may optionally include other high k dielectric materials such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof. The gate electrode 112 may be formed of polysilicon (or poly). Alternatively, the gate electrode 112 may be formed of metals, metal nitrides, or silicides. The transistors 108 may include spacers 114 located on both sidewalls of the gate structure. The spacers 114 may be formed of silicon oxide, silicon nitride, silicon oxynitride, fluoride-doped silicate glass (FSG), or a low k dielectric material.

The transistors 108 may further include source/drain regions 116 including lightly doped source/drain regions and heavy doped source/drain regions. The source/drain regions 116 may be formed by implanting p-type or n-type dopants or impurities into the substrate 106 depending on the configuration of the transistors 108. The transistors 108 may further include silicide features 120 formed on the source/drain regions 116 by a salicide (self-aligned silicide) process to form a contact. The silicide features 120 may include nickel silicide, cobalt silicide, tungsten silicide, tantalum silicide, titanium silicide, platinum silicide, erbium silicide, palladium silicide, or combinations thereof. The transistors 108 may be isolated from each other by a plurality of isolation structures 124 such as shallow trench isolation (STI) features formed in the substrate 106. The isolation structures 124 may include silicon oxide, silicon nitride, silicon oxynitride, fluoride-doped silicate glass (FSG), and/or a low k dielectric material.

Figure 3B:
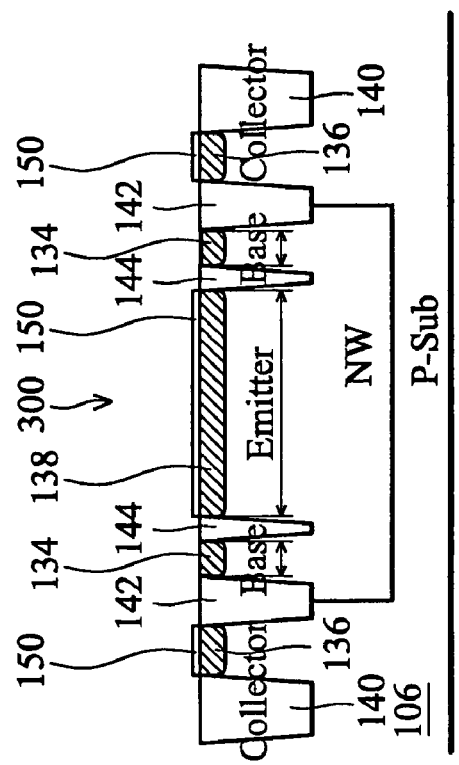
FIGS. 3A and 3B are top and cross-sectional views, respectively, of a bipolar junction transistor (BJT) device that may be implemented in the semiconductor device of FIG. 2.
Figure 3A:
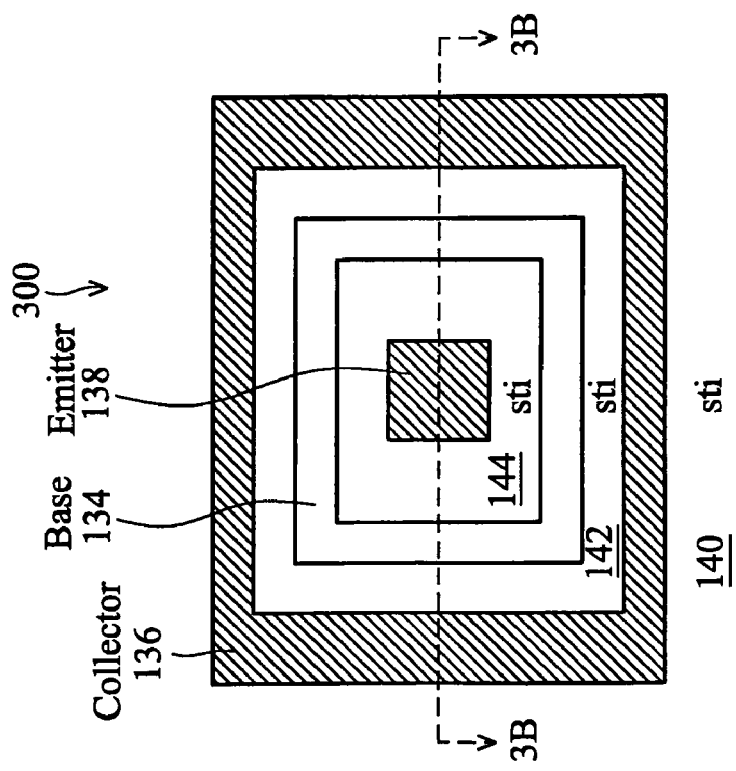

The region 104 may include a junction device such as a bipolar junction transistor (BJT) 130. Alternatively, the junction device may optionally include a diode. Referring also to FIGS. 3A and 3B, illustrated are top and cross-sectional views, respectively, of the BJT 130 of FIG. 1. The BJT 130 may be configured as an PNP transistor or NPN transistor. In the present example, the BJT 130 may include an N-doped well (NW) 132 formed in a P-doped substrate 106. The BJT 130 may further include a base structure 134, a collector structure 136, and an emitter structure 138. The base structure 134 may include an N+ doped region, the collector structure 136 may include a P+ doped region, and the emitter structure 138 may include a P+ doped region.

A plurality of isolation structures such as shallow trench isolation (STI) structures 140, 142, 144 may be formed to isolate the active regions of the BJT 130. The isolation structures 140, 142, 144 may include silicon oxide, silicon nitride, silicon oxynitride, fluoride-doped silicate glass (FSG), or a low k dielectric material. A plurality of silicide features 150 may be formed over some or all of the active regions 134, 136, 138 of the BJT 130 by a salicide (self-aligned silicide) process to form a contact. The silicide regions 150 may include nickel silicide, cobalt silicide, tungsten silicide, tantalum silicide, titanium silicide, platinum silicide, erbium silicide, palladium silicide, or combinations thereof.

After formation of the various microelectronic devices and features in the substrate 106, a stressed layer such as a contact etch stop layer (CESL) 160 may be formed overlying the regions 102 and 104. The CESL 160 may be formed of silicon nitride, silicon oxynitrides, and/or other suitable materials. An inter-level dielectric (ILD) layer 170 may be formed overlying the CESL 160 to isolate a metal interconnect structure (not shown) of the semiconductor device 100. The ILD layer 170 may include silicon oxide, silicon oxynitride, or a low k material. The ILD layer 170 may be planarized by a chemical mechanical polishing (CMP) process. Following the CMP process, the ILD layer 170 may have a good flat surface for further processing such as forming contacts and/or a metal interconnect structure. There may be a dishing effect 180 in the region 104 caused by the different pattern structures and densities in region 102 as compared to region 104. The dishing effect 180 of the ILD CMP process will not impact or damage the BJT device, active regions, and silicide features in region 104 since the ILD layer 170 has sufficient thickness 190 after the CMP process in a gate first process. However, in a gate last process, the dishing effect of a CMP process will adversely impact various structures and features in region 104 as will be discussed in detail below.

Figure 2:
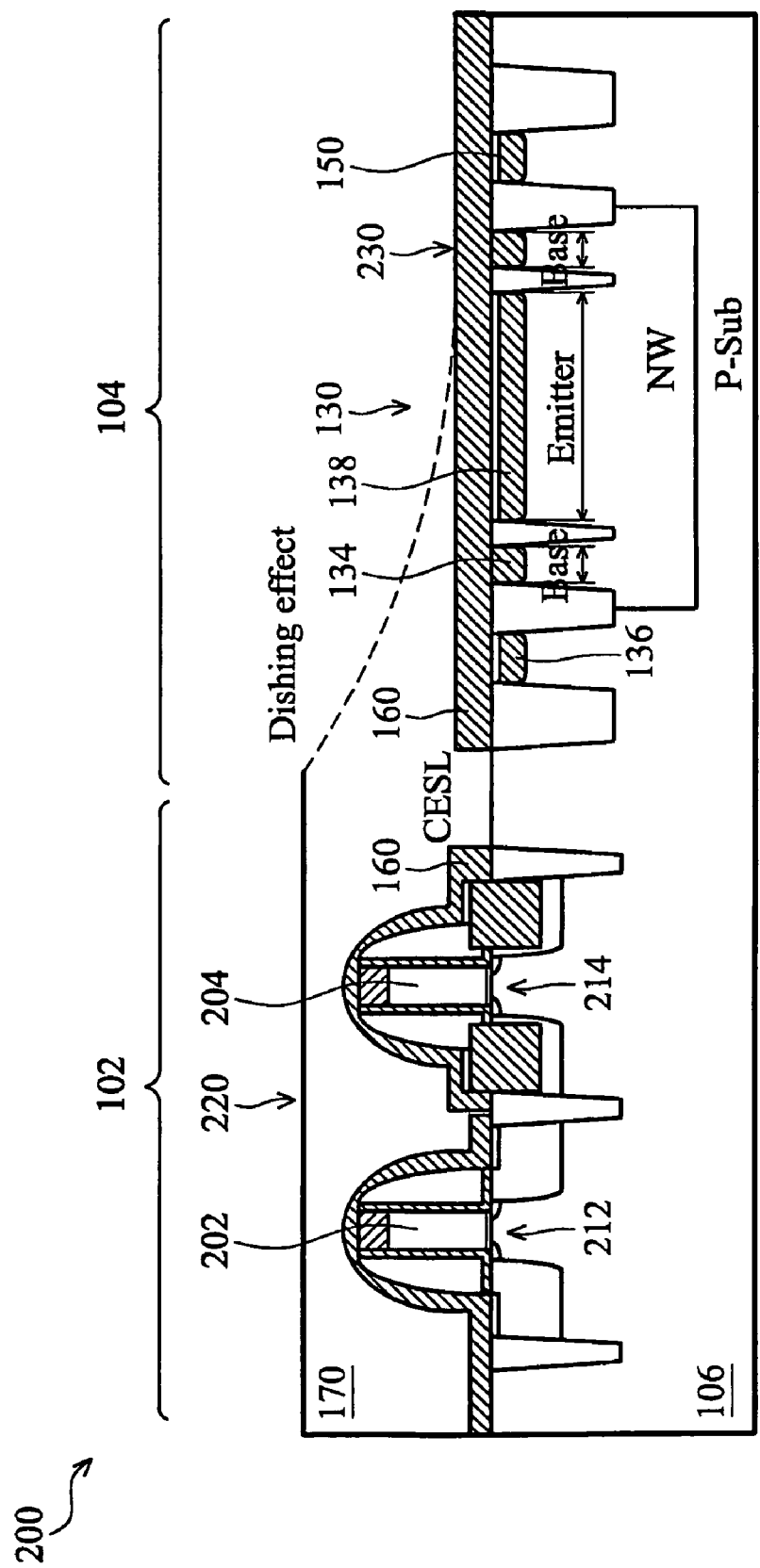
FIG. 2 is a cross-sectional view of a semiconductor device at an intermediate stage of fabrication in a gate last process.

Referring now to FIG. 2, illustrated is a semiconductor device 200 in an intermediate stage of fabrication in a gate last process. The semiconductor device 200 is similar to the semiconductor device 100 of FIG. 1 except that the semiconductor device 200 is fabricated in a gate last process instead of a gate first process discussed in FIG. 1. Similar features in FIGS. 1 and 2 are number the same for the sake of simplicity and clarity. In a gate last process, dummy polysilicon gate structures 202, 204 (instead of true gate structures 110 in FIG. 1) are formed for transistors 212, 214 in region 102. The process of forming transistors 212, 214 with the dummy poly gate structures 202, 204 may be similar to the process that forms the transistors 108 in FIG. 1 except that the dummy poly gate structures are subsequently removed and replaced with metal gate structures in a gate last process. For example, the dummy poly gate structures and source/drain structures may be formed by methods including thermal oxidation, polysilicon deposition, photolithography, ion implantation, etching, and various other methods known in the art. Also, the semiconductor device 200 may include a junction device such as a BJT 130 that may be formed in region 104 as was discussed in FIG. 1.

After formation of the various microelectronic devices and features in the substrate 106, a stressed layer such as a contact etch stop layer (CESL) 160 may be formed overlying the regions 102 and 104. The CESL 160 may be formed of silicon nitride, silicon oxynitride, and/or other suitable materials. An inter-layer (or level) dielectric (ILD) layer 170 may be formed overlying the CESL 160. The ILD layer 170 may include silicon oxide, silicon oxynitride, or a low k material. In the gate last process, the dummy poly gate structures 202, 204 may be removed so that true metal gate structures may be formed in place of the dummy poly gate structures 202, 204. Accordingly, the ILD layer 170 may be planarized by a chemical mechanical polishing (CMP) process until at a top portion 220 of the dummy poly gate structures 202, 204 is reached and exposed.

However, it has been observed that following the CMP process there may be some over-polishing (or dishing effect) 230 of the ILD layer 170 in region 104 such that damage to the BJT 130 and silicide features 150 may occur, and in some cases the active regions 134, 136, 138 of the BJT may be partially removed. The over-polishing or dishing effect 230 in region 104 may be caused by the different pattern structures and pattern densities in region 102 as compared to the isolated region 104. Further, the height of the dummy poly gate structures 202, 204 may not be sufficiently large enough to prevent damage to the various structures and features in region 104, and thus may lead to poor device performance or even device failure.

Figure 4A:
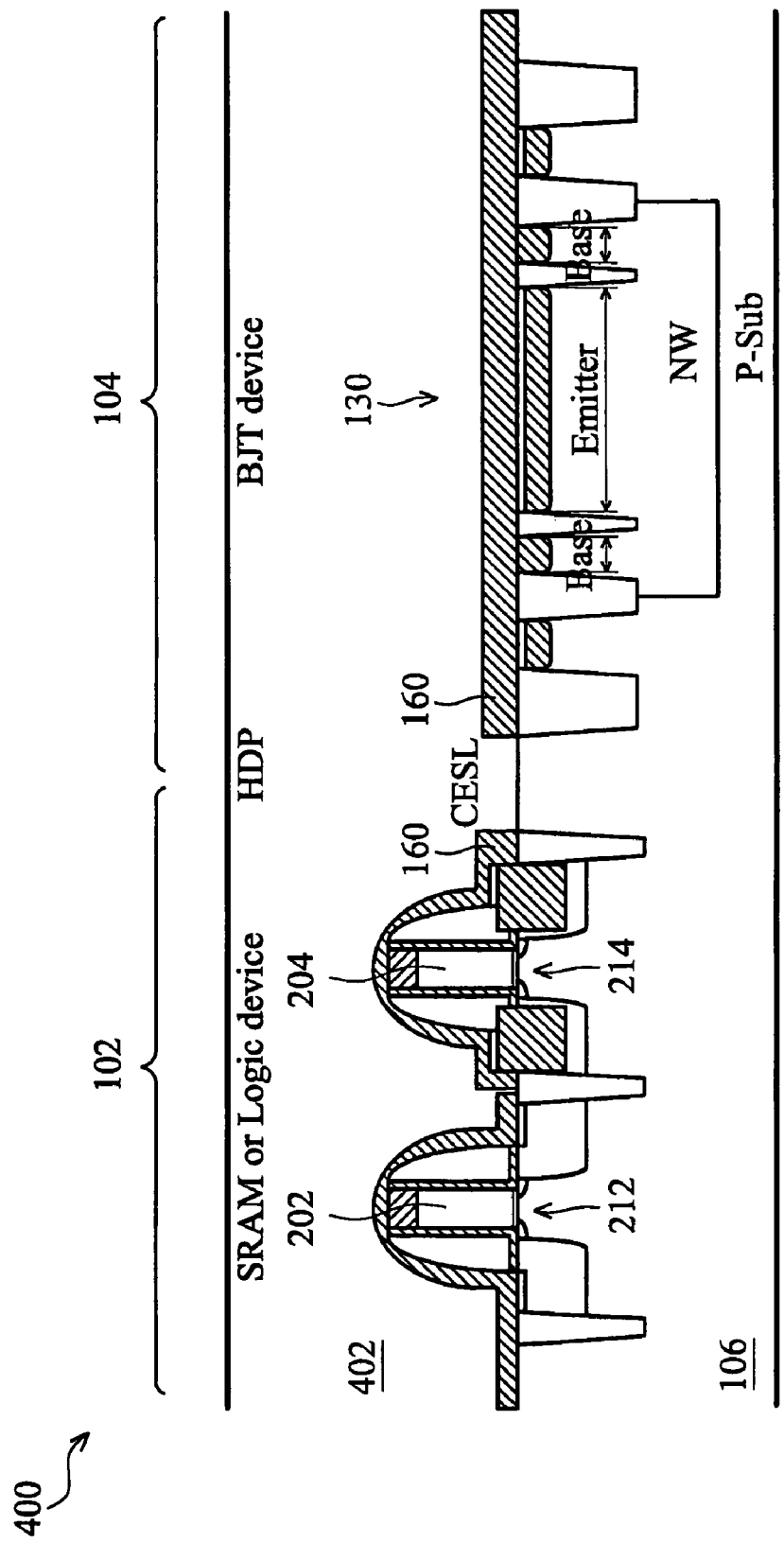
FIGS. 4A and 4B are cross-sectional views of the semiconductor device of FIG. 2 including the BJT of FIGS. 3A and 3B at intermediate stages of fabrication in a gate last process.
Figure 4B:
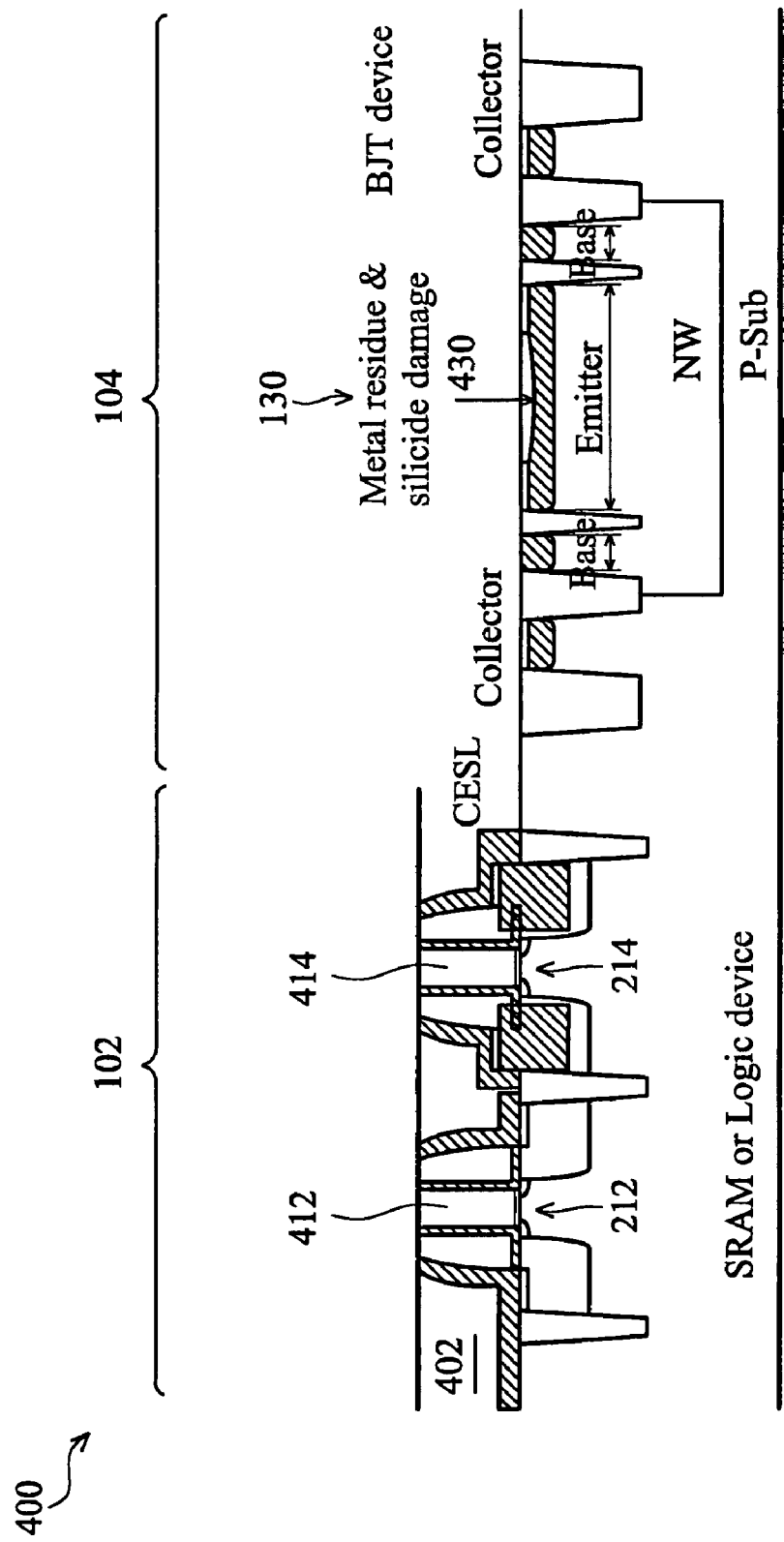

Referring now to FIGS. 4A and 4B, illustrated are cross-sectional views of a semiconductor device 400 being fabricated in a gate last process. The semiconductor device 400 is similar to the semiconductor device 200 of FIG. 2. Accordingly, similar features in FIGS. 2 and 4 are numbered the same for clarity. In FIG. 4A, the semiconductor device 400 includes a region 102 in which a plurality of transistors 212, 214 may be formed as part of an SRAM or logic circuit. The transistors 212, 214 are initially be formed with dummy poly gate structures 202, 204 that are subsequently removed and replaced with true metal gate structures. The device 400 further includes a region 104 in which a junction device such as a BJT 130 may be formed as part of an integrated circuit. As previously discussed, a stressed layer such as a contact etch stop layer (CESL) 160 may be formed overlying the regions 102 and 104. The CESL 160 may be formed of silicon nitride, silicon oxynitride, and/or other suitable materials. A dielectric layer 402 may be formed overlying the CESL 160. For example, the dielectric layer may be formed by a high density plasma (HDP) chemical vapor deposition (CVD). The dielectric layer 402 may also include silicon oxide, silicon oxynitride, and/or a low k material. Alternatively, the dielectric layer 402 may be formed by a spin-on technique, sputtering, or other suitable CVD techniques.

In FIG. 4B, a gate last process may be performed which includes a CMP process that planarizes the dielectric layer 402 so that the dummy poly gate structures 202, 204 (in FIG. 4A) can be removed and replaced with metal gate structures 412, 414. For example, the dummy poly gate structures 202, 204 (in FIG. 4A) may be removed by an etching process, and the trenches may be filled with a metal material layer by a deposition technique, and the metal layer planarized to form the metal gates 412, 414. However, during the processing above, metal residues and silicide damage 430 may occur in some or all of the active regions of the BJT 130 which may lead to poor device performance or device failure.

Figures 5A, 5B:
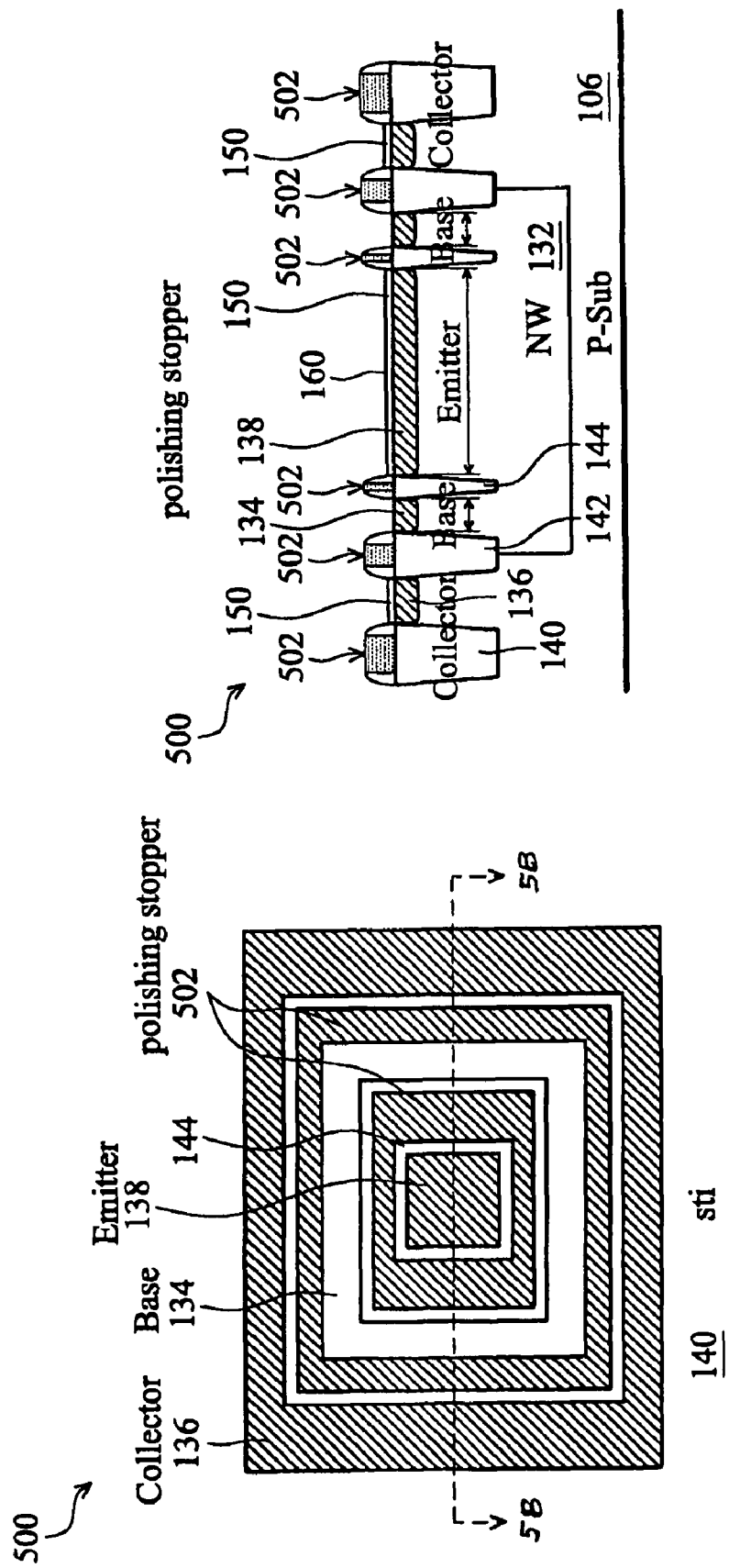
FIGS. 5A and 5B are cross-sectional views of a BJT device including a polishing stopping structure that may be implemented in a gate last process according to various aspects of the present disclosure.

Referring now to FIGS. 5A and 5B, illustrated are top and cross-sectional views, respectively, of a BJT device 500 that includes a polishing stopper structure 502 that prevents or reduces the risk of damage to the BJT device in a gate last process. The BJT device 500 is similar to the BJT device 130 of FIG. 2 except for the differences disclosed below. Similar features in FIGS. 2 and 5 are numbered the same for the sake of clarity. The BJT device 500 may be configured as an PNP transistor or NPN transistor. In the present example, the BJT device 500 includes an N-doped well (NW) 132 formed in a P-doped substrate 106. The BJT device 500 further includes a base region 134, a collector region 136, and an emitter region 138. The base region 134 may include an N+ doped region, the collector region 136 may include a P+ doped region, and the emitter region 138 may include a P+ doped region.

A plurality of isolation structures such as shallow trench isolation (STI) structures 140, 142, 144 may be formed to isolate the active regions of the BJT device 500. The isolation structures 140, 142, 144 may include silicon oxide, silicon nitride, silicon oxynitride, fluoride-doped silicate glass (FSG), and/or a low k dielectric material. A plurality of silicide features 150 may be formed over some or all of the active regions 134, 136, 138 of the BJT device 500 by a salicide (self-aligned silicide) process to form a contact. The silicide features 150 may include nickel silicide, cobalt silicide, tungsten silicide, tantalum silicide, titanium silicide, platinum silicide, erbium silicide, palladium silicide, or combinations thereof.

A polishing stopping structure 502 may be formed on some or all of the isolation structures 140, 142, 144. The polishing stopping structures 502 can prevent or reduce the risk of damage to the active regions of the BJT device 500 when being processed in a gate last process including a CMP process. Further, the polishing stopping structure 502 may be formed by a same process (or concurrently) that forms gate structures of the transistors as will be explained in detail below. Accordingly, formation of the polishing stopping structure 502 does not involve additional processing steps and does not add complexity to the processing steps used to form the polishing stopping structure 502.

Figure 6A:
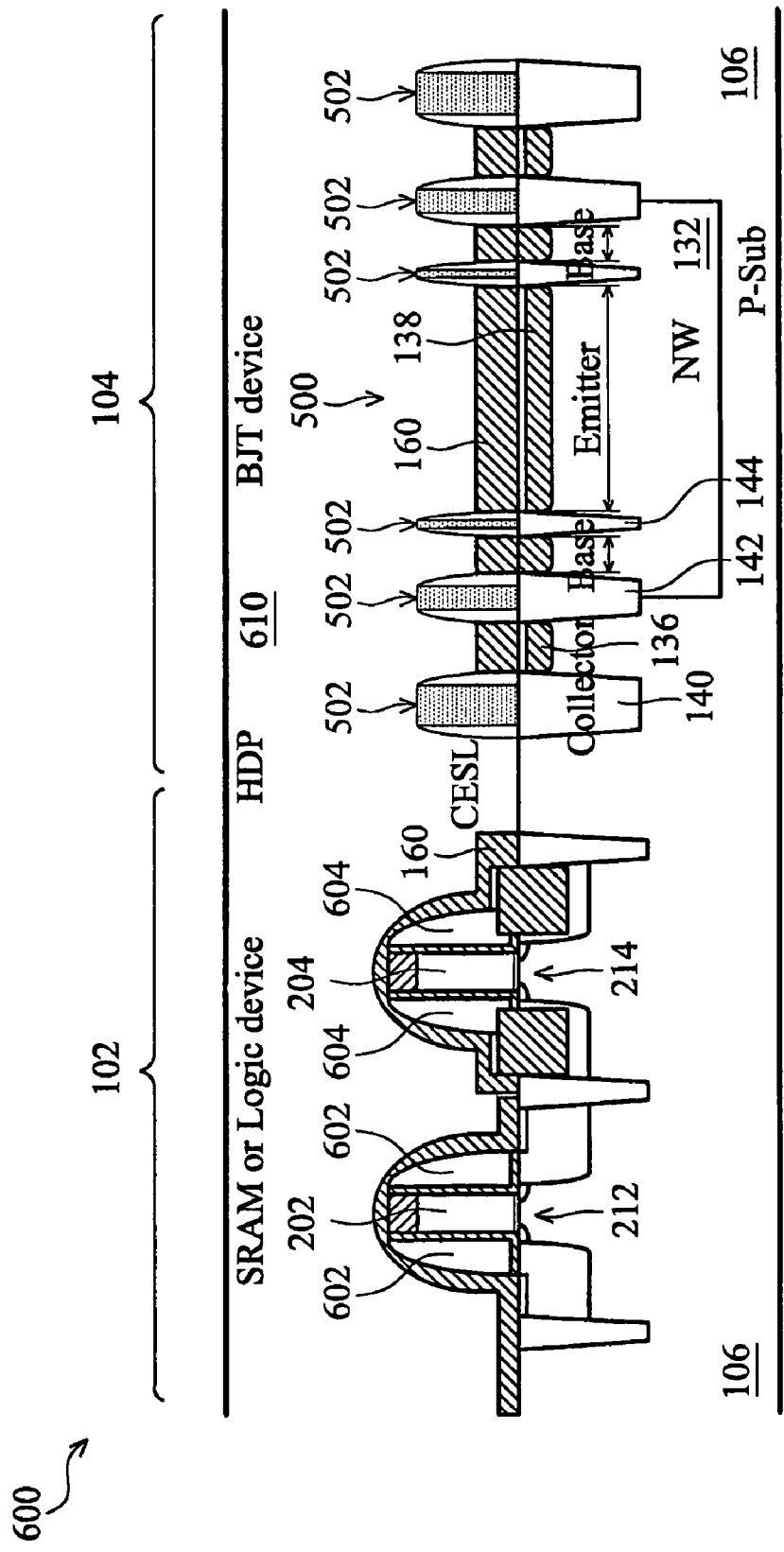
FIGS. 6A and 6B are cross-sectional of a semiconductor device including the BJT device and polishing stopping structure of FIGS. 5A and 5B at intermediate stages of fabrication in the gate last process.
Figure 6B:
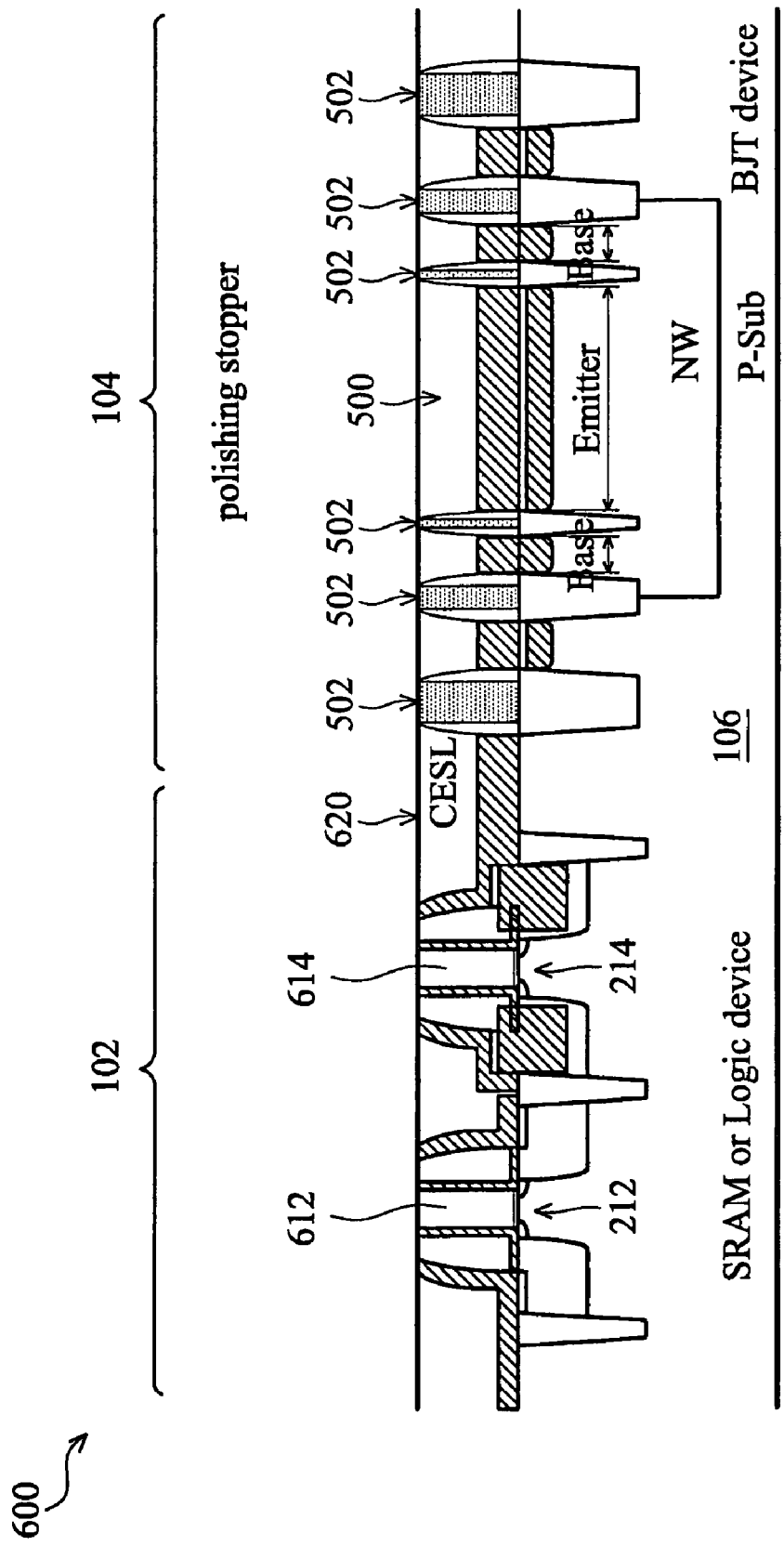

Referring to FIGS. 6A and 6B, illustrated are top and cross-sectional views, respectively, of a semiconductor device 600 including the BJT 500 of FIG. 5 at an intermediate stage of fabrication in a gate last process. The semiconductor device 600 is similar to the semiconductor device 200 of FIG. 2 except that the BJT 500 includes a polishing stopping structure 502 in region 104. Similar features in FIGS. 2 and 6 are numbered the same for the sake of clarity. The semiconductor device 600 includes regions 102 and 104 in which various passive and active microelectronic devices may be formed as part of an integrated circuit (IC). For example, the IC may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

In the present example, the semiconductor device 600 includes a region 102 in which a plurality of transistors 212, 214 may be formed as part of SRAM or logic circuit. The transistors 212, 214 may initially be formed with dummy poly gate structures 202, 204 that are subsequently removed and replaced with true metal gate structures. The transistors 212, 214 may include a gate dielectric formed of a high k dielectric material such as hafnium oxide ($HfO_2$). Alternatively, the gate dielectric may optionally include other high k dielectric materials such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof. The transistors 212, 214 may further include spacers 602, 604 located on both sidewalls of the gate structure. The spacers 602, 604 may be formed of silicon oxide, silicon nitride, silicon oxynitride, fluoride-doped silicate glass (FSG), or a low k dielectric material.

The transistors 212, 214 further include source/drain regions including lightly doped source/drain regions and heavy doped source/drain regions. The source/drain regions may be formed by implanting p-type or n-type dopants or impurities into the substrate 106 depending on the configuration of the transistors 212, 214. The transistors 212, 214 may further include silicide features formed on the source/drain regions by a salicide (self-aligned silicide) process to form a contact. The silicide features 120 may include nickel silicide, cobalt silicide, tungsten silicide, tantalum silicide, titanium silicide, platinum silicide, erbium silicide, palladium silicide, or combinations thereof. The transistors 212, 214 may be isolated from each other by a plurality of isolation structures such as shallow trench isolation (STI) features formed in the substrate 106. The isolation structures may include silicon oxide, silicon nitride, silicon oxynitride, fluoride-doped silicate glass (FSG), and/or a low k dielectric material.

The region 104 includes the BJT 500 including the polishing stopping structure 502 on some or all of the isolation structures 140, 142, 144. The polishing stopping structure 502 may be formed by the same process that forms the dummy poly gate structures 202, 204 of transistors 212, 214 including the spacers 602, 604 in region 102. Accordingly, the polishing stopping structure 502 has substantially the same material as the gate structure in region 102, and the polishing stopping structure 502 may be configured to be substantially not less than the minimum gate size formed in region 102. For example, in forming the dummy poly gate structures 202, 204 and polishing stopping structure 502, a polysilicon layer may be formed over regions 102 and 104. A photoresist layer may then be formed over the polysilicon layer, and may be patterned (e.g., photolithography) using a photomask to form a patterned poly gate feature for region 102. The same photomask may also include a patterned polishing stopping feature for region 104. The pattern for the polishing stopping structure may include a ring-type structure having a rectangular shape, a square shape, an ellipse shape, or a circular shape.

The pattern of the photoresist layer may then be transferred to the underlying polysilicon layer by a dry or wet etching process to form the dummy poly gate structures 202, 204 and polishing stopping structure 502. In some embodiments, the patterned photoresist layer may be formed on a hard mask layer and then transferred to the polysilicon layer. The spacers 602, 604 are formed by forming a dielectric layer such as silicon dioxide, silicon nitride, or silicon oxynitride over the dummy poly gate structures 202, 204 and polishing stopping structure 502, and performing an anisotropic etching of the dielectric layer leaving the spacers 602, 604 on the sidewalls of the dummy poly gate structures 202, 204, and spacers on the sidewalls of the polishing stopping structure 502. As such, the polishing stopping structure 502 may include a polysilicon stopper. Alternatively, the polishing stopping structure 502 may include a dielectric stopper.

As previously discussed, a plurality of silicide features may be formed over some or all of the active regions 134, 136, 138 of the BJT device 500 by a salicide (self-aligned silicide) process to form a contact. The silicide features may include nickel silicide, cobalt silicide, tungsten silicide, tantalum silicide, titanium silicide, platinum silicide, erbium silicide, palladium silicide, or combinations thereof. Also, a stressed layer such as a contact etch stop layer (CESL) 160 may be formed overlying the regions 102 and 104. The CESL 160 may be formed of silicon nitride, silicon oxynitride, and/or other suitable materials. A dielectric layer 610 may be formed overlying the CESL 160 by a high density plasma (HDP) chemical vapor deposition (CVD). Also, the dielectric layer 610 may include silicon oxide, silicon oxynitride, and/or a low k material. Alternatively, the dielectric layer 610 may be formed by a spin-on technique, sputtering, or other suitable CVD techniques.

In FIG. 6B, a gate last process may be performed which may include a CMP process that planarizes the dielectric layer 610 so that the dummy poly gate structures 202, 204 (in FIG. 6A) can be removed and replaced with true metal gate structures 612, 614. For example, the dummy poly gate structures 202, 204 (in FIG. 6A) may be removed by an etching process that selectively etches the polysilicon, and the openings may be filled with a metal material by a deposition technique or other suitable technique, and the metal material layer may be planarized (by CMP) to form the metal gates 612, 614. During the gate last process, the polishing stopping structure 502 helps prevent or reduces 620 the risk of the CMP process from over-polishing (e.g., or dishing effect as shown in FIGS. 2 and 4) and damaging the BJT device 500 including the active regions and the silicide features in region 104. Further, the polishing stopping structure 502 may be configured to cover at least 5% of a pattern density of region 104. In some embodiments, the polishing stopping structure 502 may be protected during removal of the dummy poly gate structures 202, 204. In some other embodiments, the polysilicon of polishing stopping structure 502 may be removed during the removal of the dummy poly gate structures 202, 204, and the trench filled with the same metal material as the metal gates 612, 614.

Figures 7A, 7B:
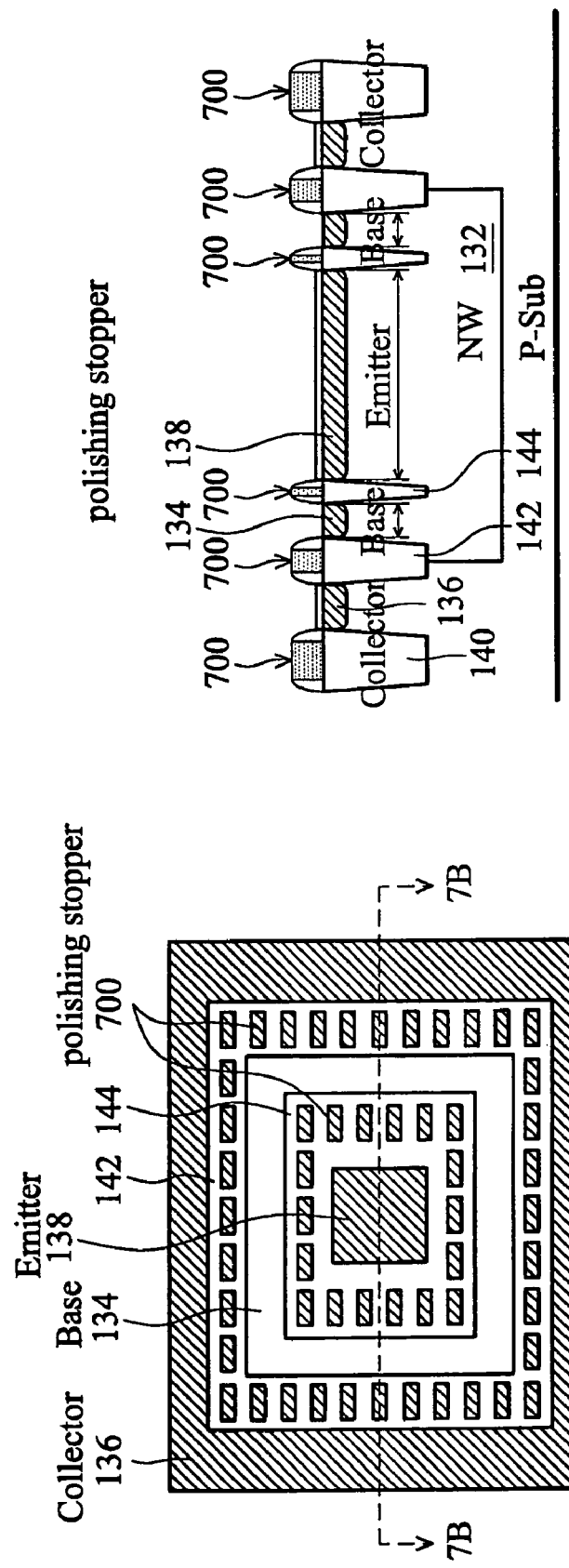
FIGS. 7A and 7B are top and cross-sectional views, respectively, of a BJT device including an alternative polishing stopping structure that may be implemented in a gate last process according to various aspects of the present disclosure.

Referring now to FIGS. 7A and 7B, illustrated are top and cross-sectional views, respectively, of an alternative polishing stopping structure 700 that may be implemented in the BJT device 500 of FIGS. 5 and 6. Similar features in FIGS. 5, 6, and 7 are numbered the same for the sake of clarity. The stopping structure 700 is similar to the stopping structure 502 of FIGS. 5 and 6 except for the shape configuration. Further, the stopping structure 700 may be formed in a similar process as discussed in FIG. 6 except that the pattern of the photoresist is different so as to form the alternative shape of the polishing stopping structure 700. The polishing stopping structure 700 may include a plurality of pillars (spaced apart from each other) overlying some or all of the isolation structures 140, 142, 144 instead of the ring-type structure of polishing stopping structure 502 (shown in FIG. 5A). The pillars may include a rectangular shape, a square shape, an ellipse shape, or a circular shape. The size and number of pillars may depend on design requirements of the integrated circuit.

Figure 8A:
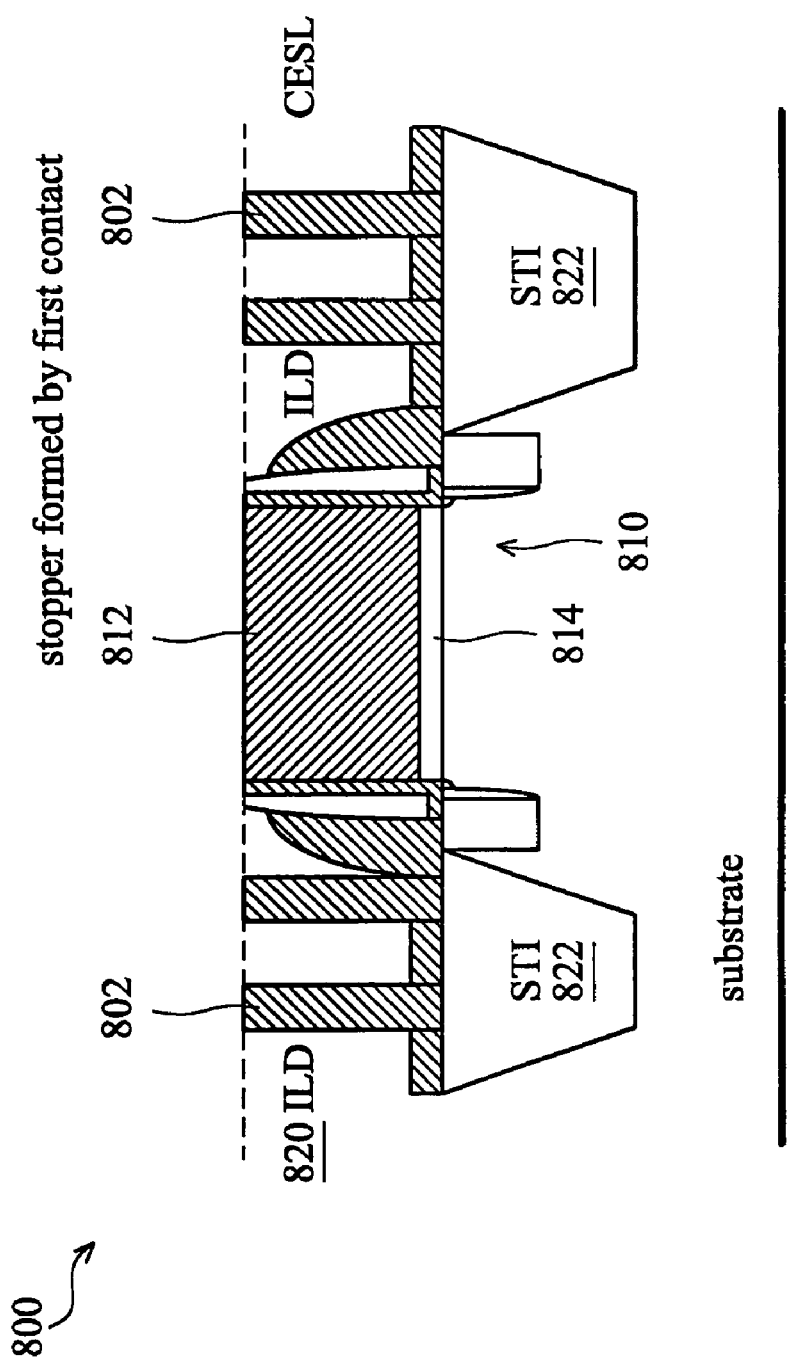
FIGS. 8A, 8B, and 8C are cross-sectional views of a contact stopping structure that may be implemented in a gate last process according to various aspects of the present disclosure.
Figure 8B:
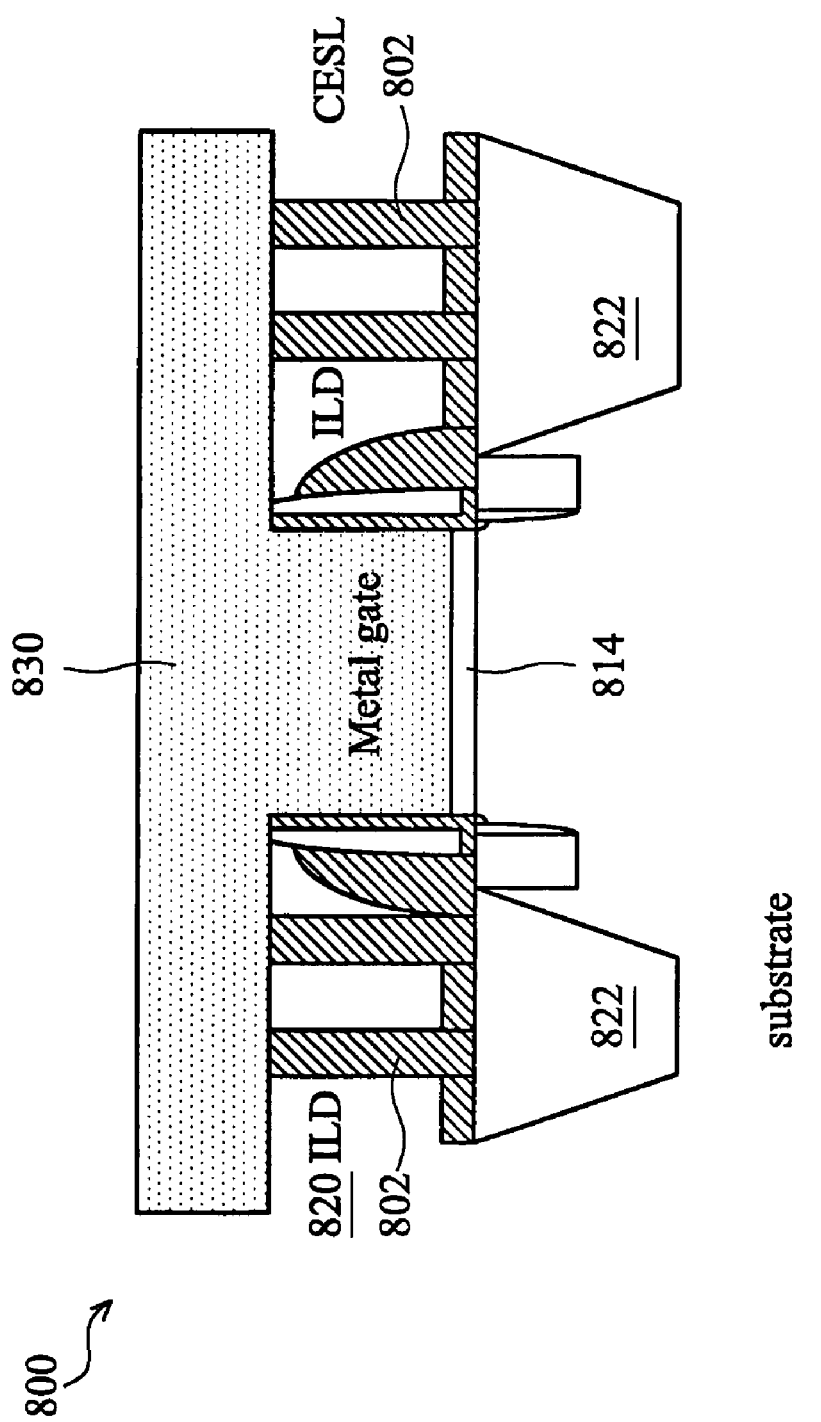
Figure 8C:
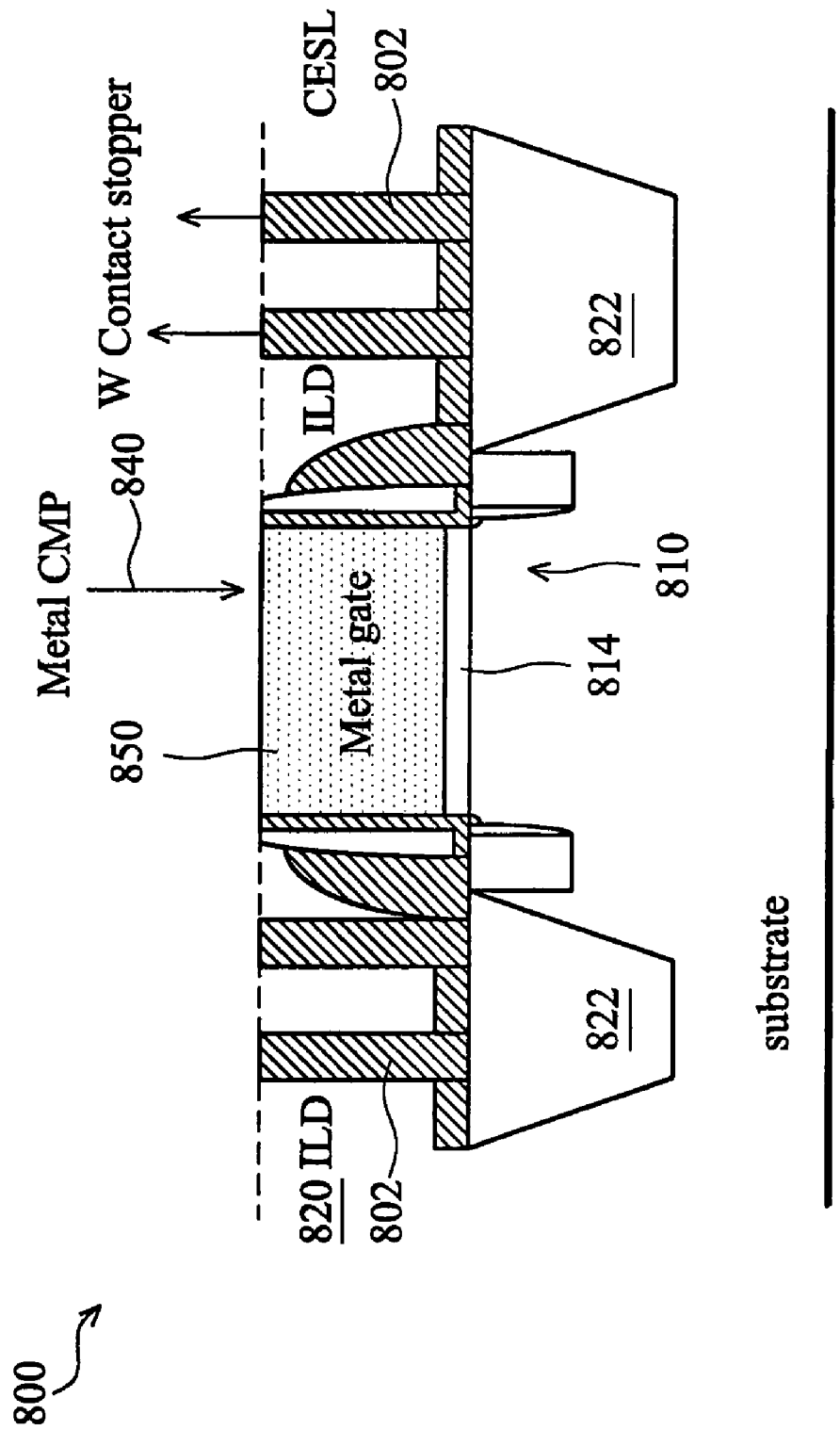

Referring now to FIGS. 8A, 8B, and 8C, illustrated are cross-sectional views of a semiconductor device 800 having a contact stopping structure 802 at various stages of fabrication in a gate last process. In FIG. 8A, the semiconductor device 800 may include a MOS device 810 that is initially formed with a dummy poly gate electrode 812 and a gate dielectric 814. The MOS device 810 may include a capacitor or transistor. The semiconductor device 800 may be implemented in any of the semiconductor devices discussed above or other semiconductor devices that include a metal CMP process that is used to form a metal gate. The MOS device 810 may be isolated by an isolation structure such as a shallow trench isolation (STI) structure 822 similar to the isolation structure of FIG. 7.

The contact stopping structure 802 may be formed on the STI structure 822 during the formation of the first contacts. For example, a dielectric layer such as an inter-level dielectric (ILD) layer 820 may be formed over the substrate and patterned to form contact holes that extend to proper doped or active regions (not shown) in the substrate and also contact holes that extend to the STI structure 822. The patterning method may be any suitable process such as photolithography and etching. Accordingly, a contact etch stop layer (CESL) is utilized for the etching process. A conductive material layer such as tungsten may be formed over the substrate filling in the contact holes, and the conductive material layer may be planarized to form the first contacts including contact stopping structure 802 in the ILD layer 820. Alternatively, the conductive material layer may include materials such as copper, copper alloy, titanium, titanium nitride, tantalum, tantalum nitride, and other suitable materials. Accordingly, the formation of the contact stopping structure 802 does not involve additional processing steps and does not add complexity to the processing steps used to form the first contacts. Further, the contact stopping structure may be formed over other structures such as active regions in the substrate.

In FIG. 8B, the dummy poly gate structure 812 may be removed by an etching process that selectively etches the polysilicon. A metal material layer 830 such as aluminum may be formed over the substrate filling in the opening created by the removal of the dummy poly gate electrode. The metal layer 830 may be formed by any suitable process known in the art. In FIG. 8C, a metal CMP process 840 may be performed on the metal layer 830 that planarizes and removes a portion of the metal material layer, and forms a metal gate 850 of the MOS device 810. The contact stopping structure 802 may help prevent or reduce the risk of a dishing effect on the metal gate 850 caused by the metal CMP process. That is, the contact stopping structure 802 may help prevent or reduce the risk of unintentional removal of a portion of the metal gate 850, which may lead to unpredictable and poor device performance. It is understood that the device 800 may undergo further processing as is known in the art.

Figure 9:
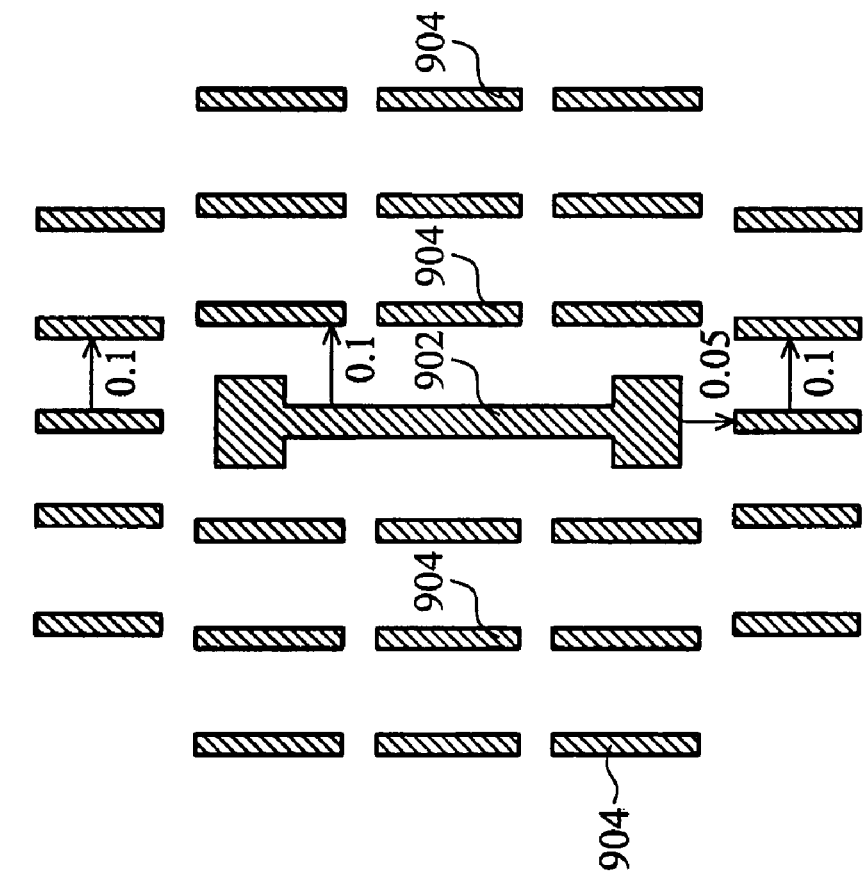
FIGS. 9 and 10 are top views of resistor layouts having a plurality of dummy poly structures that may be implemented in a gate last process according to various aspects of the present disclosure.
Figure 10:
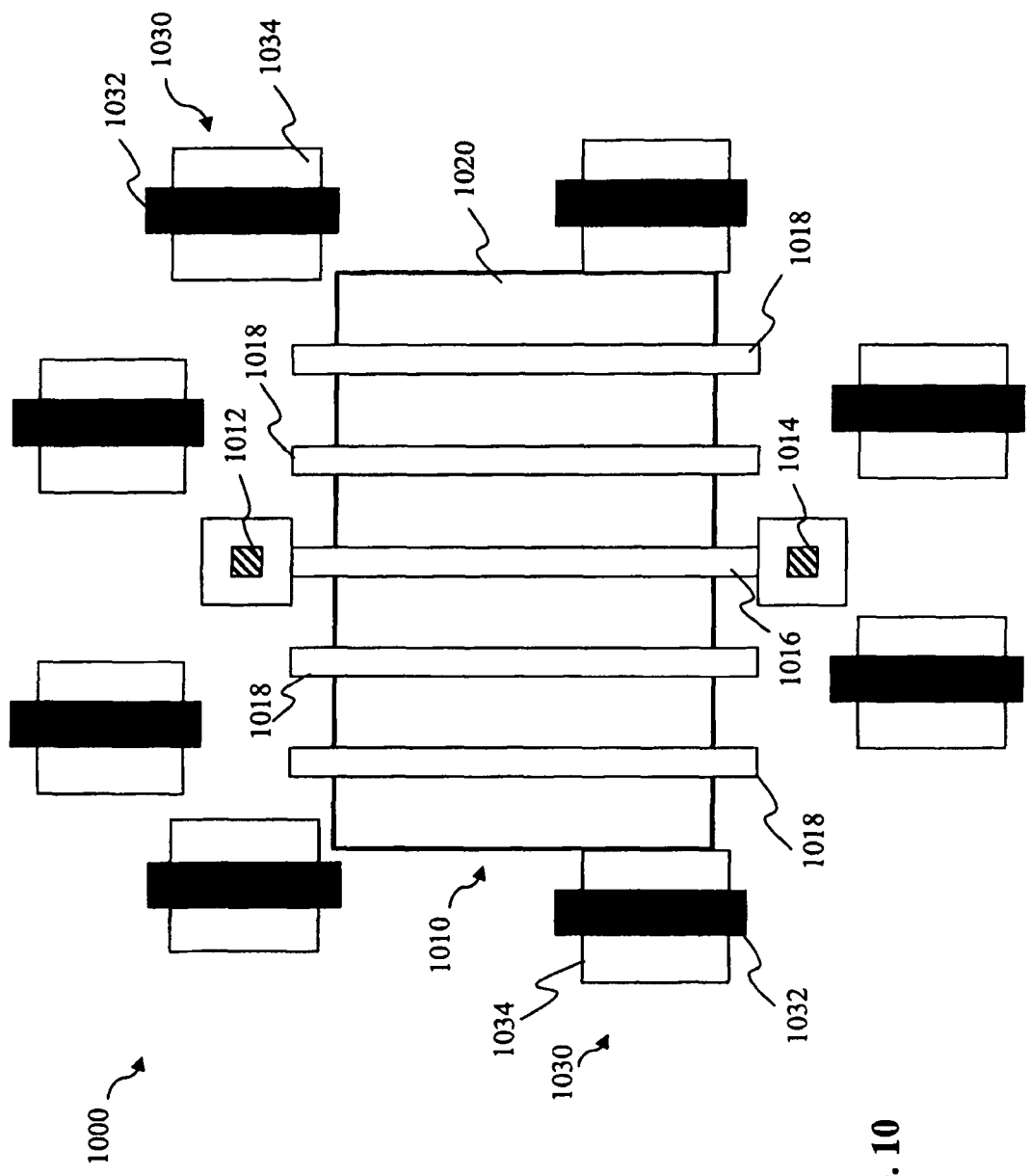

Now referring to FIGS. 9 and 10, illustrated is top view of resistor layouts 900, 1000, respectively, each having a dummy poly pattern that may be used in a gate last process. The resistor layouts 900, 1000 may be implemented in other regions of the substrate of the semiconductor devices discussed above, and may form part of the integrated circuit. As previously noted, in a gate last process, a CMP process on an ILD layer may induce dishing on a low polysilicon pattern density region where there is also a higher polysilicon pattern density region, and may even induce metal residues and silicide damage on active regions in the substrate. Accordingly, the problem may be solved by adding dummy poly gate structures in spacious regions to have a more uniform poly pattern density in all regions of the substrate. In one example, the resistor layout 900 may be implemented in a spacious region. The resistor layout 900 may include a resistor 902 (with two contacts and an active region) and a plurality of dummy poly structures 904. The dummy poly structures 904 may be formed in the same process that forms the dummy poly gate structures for transistors (not shown) in another region of the substrate.

In another example, the resistor layout 1000 may be implemented in a spacious region. The resistor layout 1000 may include a resistor region 1010. The resistor region 1010 comprises two contacts 1012, 1014 and an active region 1016. The resistor region 1010 also includes dummy active regions 1018 and a wide STI region 1020. The wide STI region 1020 and the resistor region 1010 have a low poly pattern density and thus may induce dishing during CMP which can lead to metal residues. Accordingly, a plurality of cell-like dummy structures 1030 may be provided around the resistor region 1010 to have a more uniform poly pattern density in all regions of the substrate. Each cell-like dummy structure 1030 includes a dummy poly gate structure 1032 and a dummy active region 1034. The number and size of the cell-like dummy structures 1030 will depend on design requirements and process technology. For example, it has been observed that the cell-like structures 1030 can be added when the poly pattern density is less than 5% in a 400 um$^3$ region. The dummy poly structures 1032 and dummy active regions 1034 of the cell-like dummy structure 1030 may be formed in the same process that forms the dummy poly gate structures and active regions for transistors (not shown) in another region of the substrate.

Accordingly, in a gate last process, a CMP of the ILD layer may not cause over-polishing or dishing on the ILD layer overlying the spacious region. Thus, damage to layouts of the resistors 902 and 1010 may be prevented, and the performance of the device may be improved. It is understood that dummy poly structures 904 and 1020 may be formed in other spacious regions that may also be adversely effected by the CMP process.

In summary, a gate last process may be implemented to form metal gate structures after formation of source/drain regions of transistors. The gate last process have been observed to be effective in reducing complexity of the front-end-of-the-line (FEOL) process and FEOL defect counts. Also, the gate last process can improve PFET mobility of up to 27%. However, problems with integrating other device technologies with the gate last process have arisen. Accordingly, the present disclosure provides a device and method that includes a polishing stopping structure that prevents or reduces the risk of a CMP process from over-polishing and damaging a planar active region where a junction device such as a BJT or diode, and passive devices such as a resistor or capacitor may be formed therein. The polishing stopping structure may be formed in the same process as the process that forms the gate structure, and thus the device and methods disclosed herein do not require additional processing steps and/or added complexity and costs associated with processing steps already in use. Also, a contact stopping structure may be formed in the process that forms the first contacts of a semiconductor device. Accordingly, the stopping structures disclosed herein may include a polysilicon stopper, a dielectric stopper, a metal stopper, and a contact stopper. It should be noted that different embodiments disclosed herein offer different advantages, and that no particular advantage is necessarily required for all embodiments.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the various stopping structures and dummy poly structures disclosed above can be implemented in different embodiments and can be utilized in combination with one another.

What is claimed is:

1. A semiconductor device, comprising:
   a semiconductor substrate having a first region, a second region, and a third region;
   a plurality of transistors having metal gates formed in the first region;
   an isolation structure formed in the second region;
   at least one junction device formed proximate the isolation structure in the second region;

a first stopping structure formed overlying the isolation structure in the second region;
a resistive device formed in the third region; and
a second stopping structure formed proximate the resistive device.

2. The semiconductor device of claim 1, wherein the at least one junction device includes one of a bipolar junction transistor (BJT) and a diode.

3. The semiconductor device of claim 1, wherein the first stopping structure covers at least 5 percent of a pattern density of the second region.

4. The semiconductor device of claim 1, wherein the first stopping structure includes a continuous ring-type structure having one of a rectangular shape, a square shape, an ellipse shape, and a circular shape.

5. The semiconductor device of claim 1, wherein the first stopping structure includes a plurality of pillars each having one of a rectangular shape, a square shape, an ellipse shape, and a circular shape.

6. The semiconductor device of claim 1, wherein the first stopping structure includes one of a polysilicon stopper, a dielectric stopper, a metal stopper, and a contact stopper.

7. The semiconductor device of claim 1, wherein the second stopping structure includes one of a dummy poly structure, a dummy active region, and combinations thereof.

8. A method for fabricating a semiconductor device, comprising:
providing a semiconductor substrate having a first region, a second region, and third region;
forming a plurality of transistors having metal gates in the first region;
forming an isolation structure in the second region;
forming at least one junction device proximate the isolation structure in the second region;
forming a first stopping structure overlying the isolation structure in the second region; and
forming a second stopping structure in the third region of the substrate proximate to a resistor during the same process that forms the first stopping structure overlying the isolation structure in the second region.

9. The method of claim 8, wherein the at least one junction device includes one of a bipolar junction transistor (BJT) and a diode.

10. The method of claim 8, wherein the forming the first stopping structure includes forming a stopping structure that covers at least 5 percent of a pattern density of the second region.

11. The method of claim 8, wherein the forming the plurality of transistors includes:
forming dummy poly gate structures for the transistors;
removing the dummy poly gate structures after forming source/drain regions; and
forming the metal gates in trenches created by the removal of the dummy poly gate structures, wherein the forming the first stopping structure is performed in the same process that forms the dummy poly gate structures.

12. The method of claim 11, wherein the removing the dummy poly gate structures includes performing a chemical mechanical polishing (CMP) to expose the dummy poly gate structures, the CMP substantially stopping at a level of the first stopping structure.

13. A semiconductor device, comprising:
a semiconductor substrate having a first region, a second region, and a third region, the first, second, and third regions being isolated from one another;
at least one transistor formed in the first region, the at least one transistors having a high-k gate dielectric and metal gate electrode;
at least one junction device formed adjacent to an isolation structure in the second region;
a stopping structure formed on the isolation structure in the second region;
at least one resistor device formed in the third region; and
a dummy gate structure formed proximate the at least one resistor device,
wherein the stopping structure includes a surface that is co-planar with a surface of the dummy gate structure.

14. The semiconductor device of claim 13, wherein the metal gate electrode includes a surface that is co-planar with the surface of the stopping structure.

15. The semiconductor device of claim 13, wherein the at least one junction device includes one of a bipolar junction transistor (BJT) and a diode.

16. The semiconductor device of claim 13, wherein the at least one transistor includes a plurality of transistors that are isolated from one another by a shallow trench isolation structure;
wherein the semiconductor device further includes a dummy contact stopper disposed on the shallow trench isolation structure; and
wherein the dummy contact stopper includes a surface that is co-planar with the surface of the metal gate.

17. The semiconductor device of claim 13, wherein the stopping structure includes a continuous ring-type structure having one of a rectangular shape, a square shape, an ellipse shape, and a circular shape.

18. The semiconductor device of claim 13, wherein the stopping structure includes a plurality of pillars each having one of a rectangular shape, a square shape, an ellipse shape, and a circular shape.

19. The semiconductor device of claim 13, wherein the dummy gate structure is disposed overlying a dummy active region formed in the semiconductor substrate in the third region.

20. The method of claim 8, wherein the second stopping structure includes one of a dummy poly structure, a dummy active region, and combination thereof.

* * * * *